United States Patent
Bagchi et al.

(10) Patent No.: US 9,645,185 B2
(45) Date of Patent: May 9, 2017

(54) AC TRACTION MOTOR FAULT DETECTION USING DC BUS LEAKAGE HARDWARE

(71) Applicant: FORD GLOBAL TECHNOLOGIES, LLC, Dearborn, MI (US)

(72) Inventors: Papiya Bagchi, Northville, MI (US); Benjamin A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 250 days.

(21) Appl. No.: 14/639,151

(22) Filed: Mar. 5, 2015

(65) Prior Publication Data

US 2016/0258993 A1  Sep. 8, 2016

(51) Int. Cl.
*G01R 31/14* (2006.01)
*G01R 31/02* (2006.01)
*G01R 31/42* (2006.01)
*G01R 27/02* (2006.01)
*G01R 31/00* (2006.01)

(52) U.S. Cl.
CPC .......... *G01R 31/025* (2013.01); *G01R 27/025* (2013.01); *G01R 31/007* (2013.01); *G01R 31/42* (2013.01); *Y02T 10/7241* (2013.01)

(58) Field of Classification Search
CPC combination set(s) only.
See application file for complete search history.

(56) References Cited

U.S. PATENT DOCUMENTS

| | | |
|---|---|---|
| 6,381,110 B1 | 4/2002 | Nagashima et al. |
| 7,102,356 B2 | 9/2006 | Wild |
| 7,629,794 B2 | 12/2009 | Kamata |
| 8,164,298 B2 | 4/2012 | Anwar et al. |
| 8,497,687 B2 | 7/2013 | Bauer et al. |
| 8,731,765 B2 | 5/2014 | Wang et al. |
| 2007/0249461 A1 | 10/2007 | Tsuji et al. |
| 2012/0217920 A1 | 8/2012 | Singh et al. |
| 2013/0099795 A1 | 4/2013 | Kamata et al. |
| 2013/0218491 A1* | 8/2013 | Wei .......... G01R 31/42 702/58 |

FOREIGN PATENT DOCUMENTS

EP  2487496 A1  8/2012

\* cited by examiner

*Primary Examiner* — Minh Phan
(74) *Attorney, Agent, or Firm* — David B. Kelley; MacMillan, Sobanski & Todd, LLC (57) ABSTRACT

An electrified vehicle has first and second DC buses and a chassis ground. A leakage detector has a detector switch and detector resistor in series between the first bus and chassis ground. A voltage measured across the detector resistor is proportional to a leakage resistance between the second bus and chassis. An inverter has a plurality of phase legs, each having first and second phase switches coupled between the buses. An AC traction motor has phases coupled to the phase legs. An inverter control circuit receives data messages having a predetermined latency period from the detector identifying a measured leakage resistance. Switching events are detected during which a phase switch is closed for a duration greater than the latency period. An electrical short is indicated if the measured leakage resistance in a data message received during a detected switching event is less than a predetermined threshold.

10 Claims, 5 Drawing Sheets

AC TRACTION MOTOR FAULT DETECTION USING DC BUS LEAKAGE HARDWARE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to electrified vehicles using a high voltage bus, and, more specifically, to detecting isolation faults (i.e., leakage) occurring at a load side of an inverter drive.

Electrified vehicles such as for electric vehicles and hybrid electric vehicles typically utilize a high voltage power bus driven by a DC power source which may include storage and/or conversion devices such as a multi-cell battery pack or a fuel cell. The presence of high-voltage buses creates a need for monitoring of the electrical isolation of each bus with respect to the electrically conductive components of the vehicle chassis (ground).

The leakage resistance present between a DC bus and chassis ground must be sufficiently large to maintain safety and to comply with regulations. A typical leakage detector circuit operates by periodically connecting one bus at a time to chassis ground through a current-limiting resistance, and using the resulting current flow (e.g., voltage drop across the resistance) to calculate the leakage resistance between the opposite bus and ground. The battery voltage divided by the calculated leakage resistance characterizes the electrical isolation. An example of DC bus leakage detection is provided in U.S. application Ser. No. 14/104,243, entitled "Leakage Detection Circuit with Integral Circuit Robustness Check" filed Dec. 12, 2013, incorporated herein by reference in its entirety.

A typical component in an electric drive system is a Battery Energy Controller Module (BECM) that includes or can be programmed to include various battery management and communication functions as well as monitoring battery cell voltage production, current flow, temperature, and other parameters. Detection of DC bus leakage resistance may typically be implemented using the BECM for controlling the detector switches and measuring the detector voltages. Various battery monitoring integrated circuit devices have been developed commercially for use in the vehicle environment. Examples of a commercially available battery monitoring IC device include the AD7280A device available from Analog Devices, Inc., of Norwood, Mass., the LTC6804 device available from Linear Technology Corporation of Milpitas, Calif., and the ISL94212 Multi-Cell Li-Ion Battery Manager available from Intersil Corporation of Milpitas, Calif.

DC bus leakage detection as described above is responsive to isolation faults occurring on the DC input side of an inverter that couples the DC buses to an AC traction motor and/or generator. It is likewise necessary to detect isolation faults on the AC side of the circuit including the AC traction motor or generator and the wiring cables from the inverter to the motor/generator. However, the detection of isolation faults in the AC circuit have required separate detectors or other monitors connected to the AC circuits, resulting in added cost and complexity.

SUMMARY OF THE INVENTION

The invention uses detection circuitry of the type capable of detecting battery/bus leakage resistance for additionally detecting AC leakage resistance of the motor/generator cables and windings. Leakage resistance of the AC circuits can be detected during AC operation or during times that the motor or generator are not rotating.

In one aspect of the invention, an electrified vehicle comprises first and second DC buses connectable to a DC power source. A chassis ground is distributed within the vehicle. A DC bus leakage detector circuit has a detector switch and a detector resistor in series between the first bus and the chassis ground, wherein a voltage measured across the detector resistor is proportional to a leakage resistance between the second bus and the chassis ground. An inverter has a plurality of phase legs, each phase leg having first and second phase switches coupled between the first and second buses. An AC traction motor has a plurality of phases coupled to the phase legs. An inverter control circuit is coupled to the leakage detector circuit and to the phase legs. The control circuit is adapted to receive data messages according to a predetermined latency period from the detector circuit identifying a measured leakage resistance. Switching events are detected during which a phase switch is closed for a duration greater than the latency period. An electrical short of the motor to the chassis ground is indicated if the measured leakage resistance in a data message received during a detected switching event is less than a predetermined threshold.

DETAILED DESCRIPTION OF PREFERRED EMBODIMENTS

The term "electrified vehicle" as used herein includes vehicles having an electric motor for vehicle propulsion, such as battery electric vehicles (BEV), hybrid electric vehicles (HEV), and plug-in hybrid electric vehicles (PHEV). A BEV includes an electric motor, wherein the energy source for the motor is a battery that is re-chargeable from an external electric grid. In a BEV, the battery or other DC source supplies energy for vehicle propulsion. A HEV includes an internal combustion engine and an electric motor, wherein the energy source for the engine is fuel and the energy source for the motor is a DC storage unit such as a battery. In a HEV, the engine is the main source of energy for vehicle propulsion with the battery providing supplemental energy for vehicle propulsion (e.g., the battery buffers fuel energy and recovers kinematic energy in electric form). Instead of driving the wheel directly, the engine may drive a generator for producing electrical power for driving the traction motor or for storage in the battery. A PHEV is like a HEV, but the PHEV may have a larger capacity battery that is rechargeable from the external electric grid. In a PHEV, the battery may be the main source of energy for vehicle propulsion until the battery depletes to a low energy level, at which time the PHEV operates like a HEV for vehicle propulsion.

Figure 1:
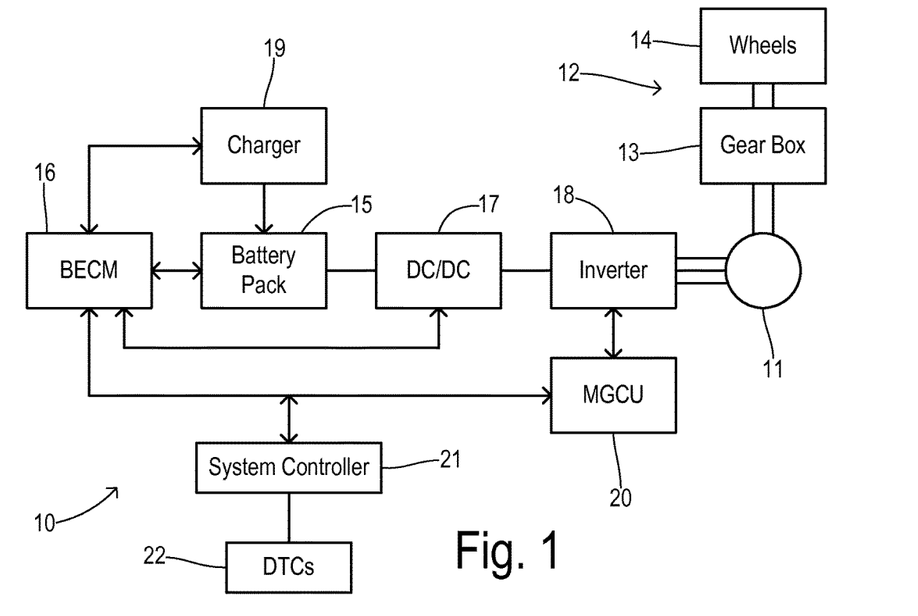
FIG. 1 is a block diagram showing relevant portions of an electrified vehicle to which the present invention is applied.

By way of a simplified example, FIG. 1 depicts a vehicle 10 as a battery electric vehicle (BEV) propelled by an electric motor 11 without assistance from an internal combustion engine. Motor 11 receives electrical power and provides drive torque for vehicle propulsion. Motor 11 may also function as a generator for converting mechanical power into electrical power through regenerative braking. Motor 11 is part of a powertrain 12 in which a gearbox 13 couples motor 11 to driven wheels 14. Gearbox 13 adjusts the drive torque and speed of motor 11 by a predetermined gear ratio.

Vehicle 10 includes a main battery pack 15 and a battery energy controller module (BECM) 16. BECM 16 supervises battery operation, performs battery monitoring, and controls a battery charger 19. An output of battery pack 15 is connected via a DC-to-DC converter 17 to an inverter 18 which converts the direct current (DC) power supplied by the battery to alternating current (AC) power for operating motor 11 in accordance with commands from a motor/generator control unit (MGCU) 20. MGCU 20 monitors, among other things, the position, speed, torque, and power consumption of motor 11 and provides output signals corresponding to this information to other vehicle systems including a main vehicle system controller 21 (which may be a powertrain control module, or PCM, for example). A memory 22 may be provided in controller 21 or elsewhere in vehicle 10 in order to store diagnostic trouble codes (DTCs) as known in the art.

Figure 2:
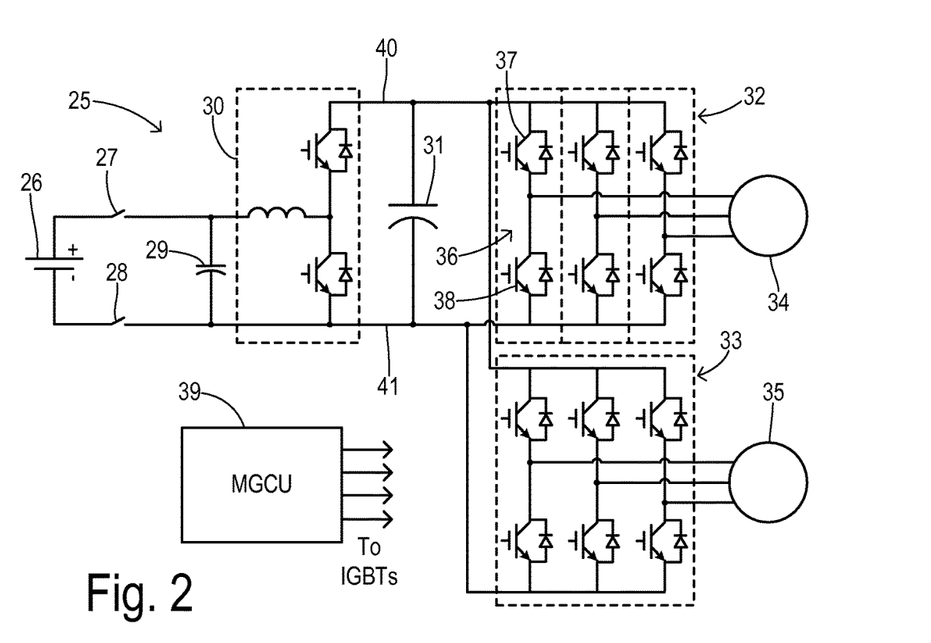
FIG. 2 is a schematic diagram showing one typical electric drive for implementing the present invention.

FIG. 2 shows another embodiment of an electric vehicle drive system 25 with a DC power source 26 (such as a battery pack or a fuel cell) coupled by contactor switches 27 and 28 to an input capacitor 29. Contactors 27 and 28 are preferably mechanical switches having an open state and a closed state for selectively coupling battery 26 to input capacitor 29 according to a driving mode of drive system 25.

A variable voltage converter (VVC) 30 couples input capacitor 29 to a main capacitor 31 which functions as a linking capacitor for inverters 32 and 33, for example. Each inverter includes a plurality of switching devices in a bridge configuration. The switches in inverter 32 are switched in a desired manner to drive a motor 34. Inverter 33 is switched to regenerate energy from a generator 35 onto main capacitor 31 and DC power source 26.

Each of the phase switching devices in inverters 32 and 33 are preferably comprised of an insulated-gate bipolar transistor (IGBT). Each IGBT preferably includes anti-parallel diode. In a first leg 36 of inverter 32, an upper phase switch 37 and a lower phase switch 38 are coupled between a first, positive DC bus 40 and a second, negative DC bus 41. Second and third phase legs are similarly configured. Each IGBT has a respective control (i.e., gate) terminal coupled to an MGCU controller 39 which controls the switches according to various operating modes of the inverters via a PWM signal as known in the art.

Figure 3:
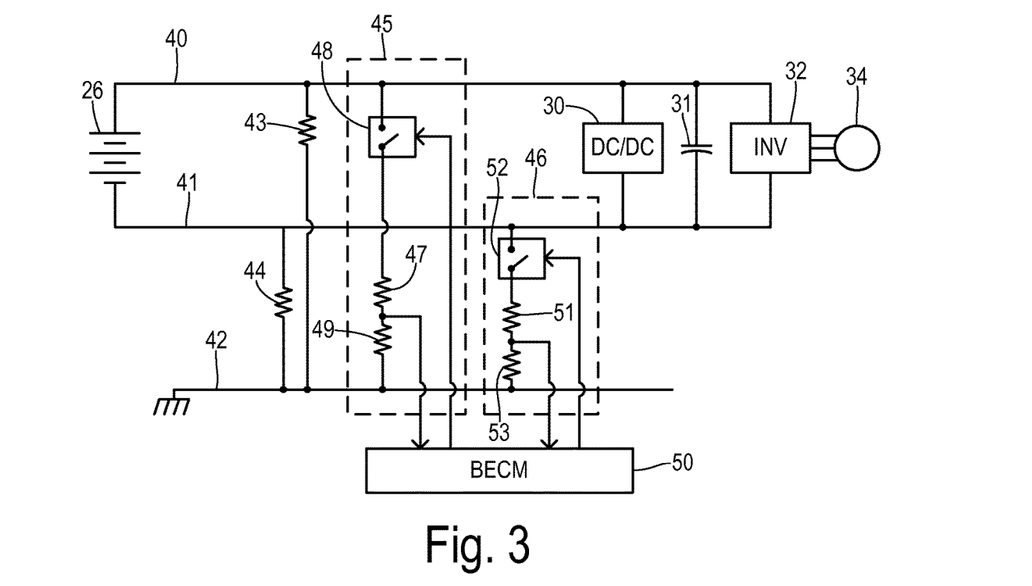
FIG. 3 is a schematic diagram showing bus leakage resistances to chassis ground and corresponding leakage resistance detectors.

FIG. 3 shows bus leakage resistances and corresponding detectors for the drive system of FIG. 2. A chassis ground 42 represents conductive parts of the vehicle whose electrical potential is taken as a reference and which are conductively linked together. Electrical isolation of buses 40 and 41 is determined by the electrical leakage resistance between each bus and chassis ground 42. Thus, a leakage resistance 43 represents the level of isolation between positive bus 40 and chassis 42. A leakage resistance 44 represents the isolation between negative bus 41 and chassis 42. FIG. 3 shows apparatus for detecting leakage resistance wherein a first detector circuit 45 is arranged between positive bus 40 and chassis ground 42 and a second detector circuit 46 is arranged between negative bus 41 and chassis ground 42. First detector circuit 45 includes a current-limiting resistor 47 in series with a sampling switch 48 and a current-sensing resistor 49. A controller circuit 50 (e.g., included in the BECM) is connected to switch 48 for selectively activating switch 48 so that a resulting first current flowing through detector circuit 45 creates a voltage across current-sensing resistor 49 proportional to the current passing through resistor 44 which is also passing through leakage resistance 44. The measured voltage is provided to controller circuit 50 which uses the voltage value as an indication of the current which then specifies the magnitude of leakage resistance 44. Likewise, second detector circuit 46 includes a series connection of a current-limiting resistor 51, sampling switch 52, and current-sensing resistor 53 similarly connected to controller circuit 50.

In a simplified example, the leakage resistance detection system determines a leakage resistance $R_L$ of one of the buses using the detector current $I_D$ flowing through the detector resistance $R_D$ (e.g., the sum of resistors 47 and 49) and a measured battery voltage $V_B$ as follows:

$$R_L = \frac{V_B}{I_D} - R_D$$

The resulting leakage resistance value can be compared with an isolation threshold (e.g., 500 ohms/volt), and if it is less than the threshold then an isolation fault is detected. In response to the fault, a corresponding DTC may be set by BECM controller 50 and/or an indicator may be turned on to inform the driver of the condition. Several different threshold levels can be used with a different response initiated for each (such as allowing the vehicle to run to a stop but preventing future start-ups at one threshold level and merely generating a driver warning when leakage resistance is below a higher threshold level).

In the process of periodically checking DC bus isolation by measuring the bus leakage resistances while the drive system is operating, BECM 50 alternately activates detectors 45 and 46 for predetermined periods of time. In one embodiment, each period may last about 3 seconds, with current measurements being taken about every 10 milliseconds by the detector which is active during the period. To improve robustness, the plurality of current measurements taken during one period are typically filtered (e.g., averaged) before comparing to the threshold.

Figure 4:
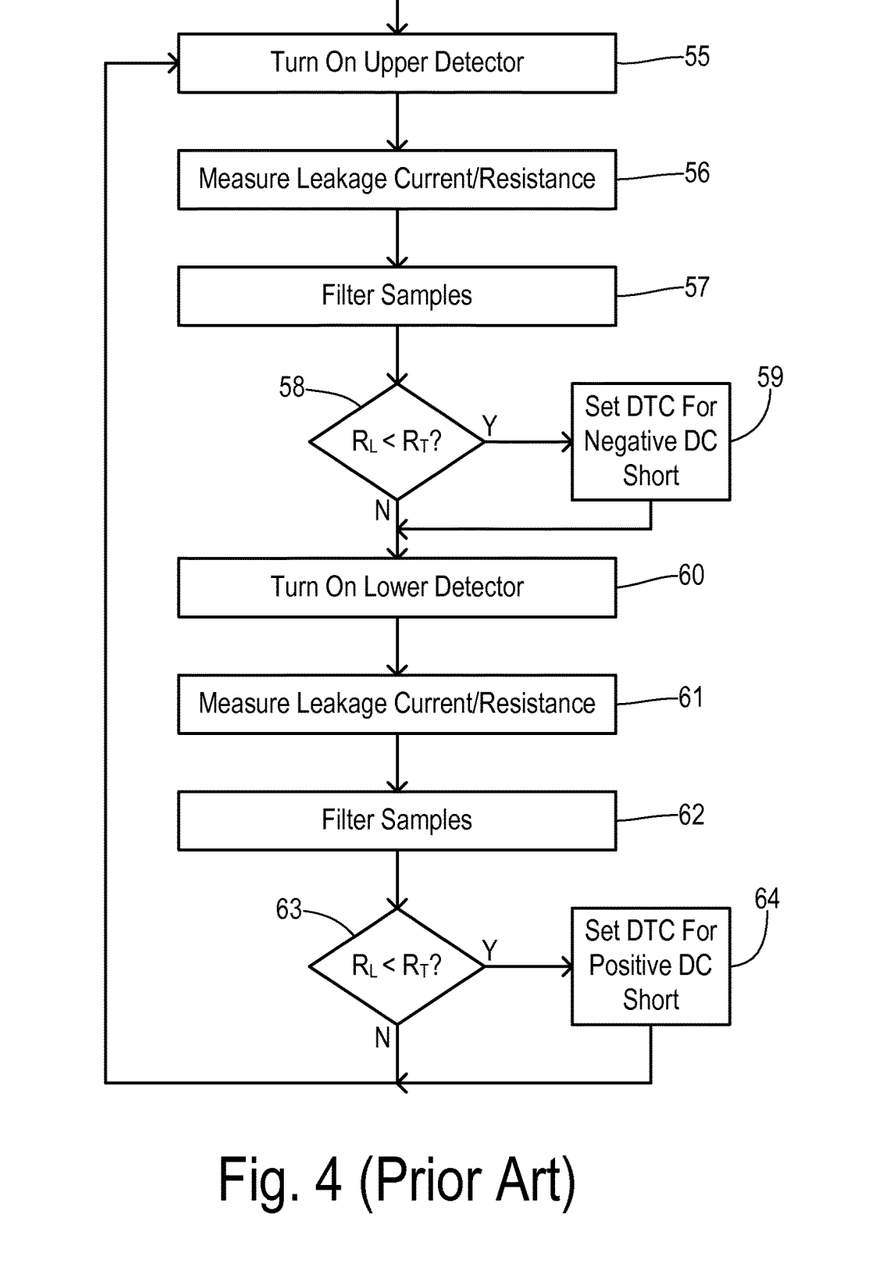
FIG. 4 is a flowchart showing a prior art method of detecting isolation faults between a DC bus and chassis ground.

A known method for checking DC bus isolation is summarized in the flowchart of FIG. 4. In step 55, an upper bus leakage detector circuit is turned on for a predetermined duration. During step 56, a plurality of samples are obtained by the detector circuit by measuring the leakage resistance based on sensing a current flow through the detector circuit which is proportional to the leakage resistance between the negative DC bus and chassis ground. Since the voltage drop measured across the detector resistor is proportional to the desired leakage resistance value, the data processing can operate directly on the measured voltages, or alternatively the calculations can be performed so that data processing including comparisons with a threshold can use actual resistance values.

In step 57, the plurality of sampled values are filtered in order to remove noise and obtain a more robust determination of the leakage resistance. In step 58, the filtered leakage resistance value $R_L$ is compared to a leakage resistance threshold $R_T$. If leakage resistance is below the threshold, then a diagnostic trouble code (DTC) is set in step 59 for indicating a negative DC short (i.e., isolation fault). If the leakage resistance is above the threshold or following the setting of a DTC, the method proceeds in step 60 to turn on the lower DC bus leakage detector circuit (the upper detector is also turned off). A plurality of detector voltage/current measurements for characterizing the leakage resistance are obtained in step 61, and then the samples are filtered in step 62. A filtered leakage resistance value $R_L$ is compared with the leakage resistance threshold $R_T$ in step 63. If the leakage resistance is less than the threshold, then a DTC is set in step 64 to indicate a positive DC bus short. Then the method returns to step 55 to use of the upper detector circuit again.

Figure 5:
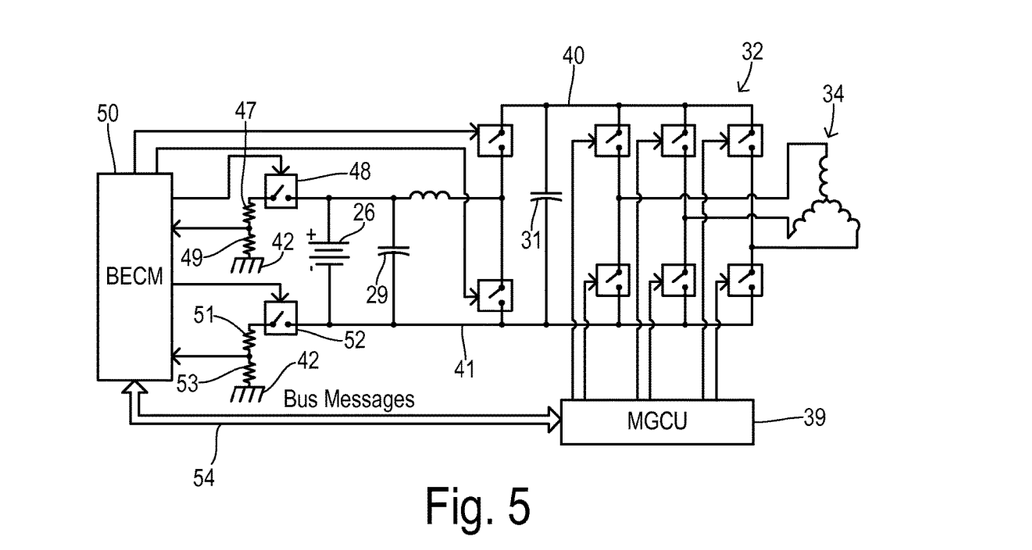
FIG. 5 is a schematic diagram showing a controller architecture in which data messages carrying bus leakage resistance information are transmitted to an inverter controller.

The present invention extends the use of the DC bus leakage detector circuits to achieve detection of isolation faults or short circuits in the AC load circuitry (e.g., motor cables and windings) as shown in FIG. 5. BECM 50 is coupled to inverter controller 39 via a multiplex bus 54, wherein bus 54 transmits data messages that are generated in response to each of the measured samples obtained from the bus leakage detector circuits. Bus 54 may be comprised of a CAN bus, for example. In order to provide fast detection of the occurrence of an isolation fault, data messages may preferably be generated without any intentional delays in response to each new leakage resistance measurement. A typical data message would include a value for the measured leakage resistance (e.g., either the measured voltage or a calculated leakage resistance) together with an identification of the positive or negative bus leakage detector that generated the respective measured sample. The information in the data messages is received and becomes available for processing within inverter controller 39 after a predetermined latency period which is comprised of a) a delay inherent in the sampling frequency (e.g., about 10 ms) and b) a message latency inherent in formatting, transmitting, and decoding the bus messages (typically about 10 ms). Thus, a combined latency period may be about 20 ms. Due to the latency period, the leakage resistance value of a data message is only useful to inverter controller 39 during certain circumstances as described below.

During many operating regimes of an inverter driven AC traction motor for an electrified vehicle, the PWM switching of the phase switches in the inverter phase legs occurs at a sufficiently high frequency that the continuous activation of a phase switch is generally less than the latency period of the leakage resistance data. However, during some conditions such as low speed operation, a phase switch may be continuously active (turned on) for longer than the latency period, which means that a particular leakage resistance measurement can then be associated with a particular phase switch configuration. When the association can be made, then a calculation can be performed which links the measured leakage resistance value to a leakage resistance occurring in the motor (i.e., at the motor cables or windings). Assuming that no significant leakage occurs simultaneously at the DC buses, then an electrical short of the motor to chassis ground can be quantified.

Figure 6:
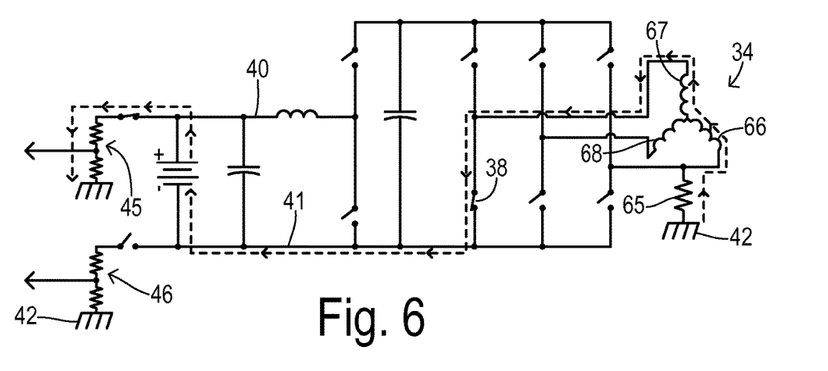
FIG. 6 is a schematic diagram of one state of the inverter and DC leakage resistance detector which achieves a current flow through an AC leakage resistance making an AC isolation fault detectable using the DC leakage detector.

FIG. 6 depicts one such condition in which upper bus leakage detector circuit 45 has its transistor switch in a closed position for sampling voltages across a detector resistor which are proportional to a leakage resistance between the chassis ground 42 and negative bus 41. In addition, the measured voltages also depend on any leakage resistance 65 present between a winding 66 of motor 34 and chassis ground 42. The necessary condition for being able to determine the value of leakage resistance 65 is that any one of the lower phase switches such as phase switch 38 is closed for a period of time at least as long as the predetermined latency period.

Figure 7:
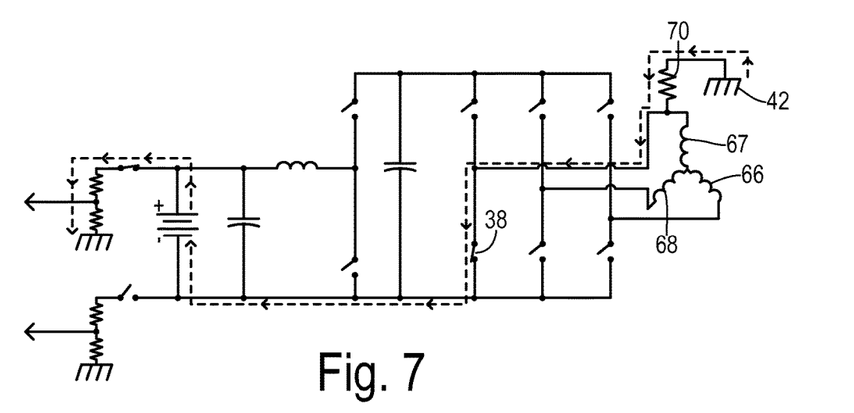
FIG. 7 is a schematic diagram showing that an AC isolation fault at a different location is still detectable in the state of the inverter and DC leakage resistance detector shown in FIG. 6.

When upper detector circuit 45 is active, any one of the lower phase switches which are directly connected to negative DC bus 41 could provide the necessary circuit continuity for detecting the AC leakage resistance. Furthermore, the exact location of any isolation faults resulting in a low measured leakage resistance can be anywhere on the AC load side of the inverter since the leakage current can pass through the motor windings as shown in FIG. 6. FIG. 7 shows the same switch activations wherein an electrical short creating a low leakage resistance 70 instead occurs along an input cable leading to motor winding 67. Even thought the short is in a different location, it is still detectable through the closure of phase switch 38.

Figure 8:
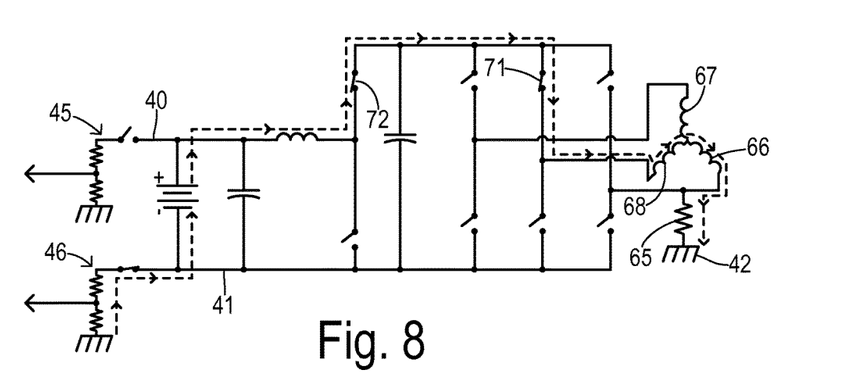
FIG. 8 is a schematic diagram showing a different state of the inverter and DC leakage resistance detector which achieves a current flow through the same AC isolation fault which is detectable using the DC leakage resistance detector coupled to the other DC bus.

FIG. 8 shows a circuit configuration at a different time wherein the detector switch of lower detector circuit 46 is closed for the purpose of generating leakage resistance data of positive DC bus 40. A phase switch 71 being the upper half of a middle phase leg and connected to positive DC bus 40 is activated. A switch 72 of the DC/DC converter may also need to be closed during the time when phase switch 71 is closed to complete a detection path. The closed or actuated state of switch 72 may be determined directly by the inverter controller or may be included as data in the data message from the BECM controller. With lower detector 46 being active with any one of the upper phase switches connected to the positive DC bus being closed continuously for a time greater than or equal to the latency period, a closed circuit is formed which passes through the closed switches, motor windings 68 and 66, and leakage resistance 65. Consequently, the inverter controller is able to detect instances in which a phase switch is closed for a sufficient amount of time and is then able to assess data messages received from the BECM controller to check whether the needed leakage resistance measurements are available in order to determine whether any motor cables or windings experience a leakage resistance less than a threshold.

Figure 9:
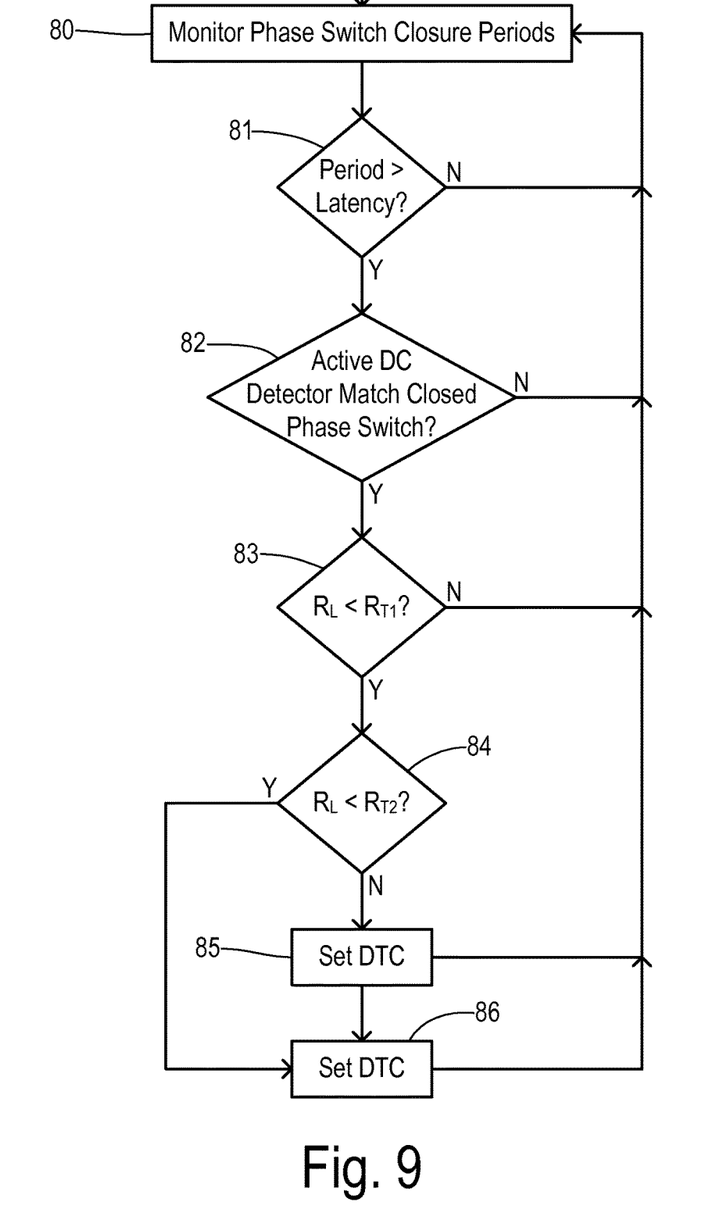
FIG. 9 is a flowchart showing one preferred method of the invention.

One preferred method of the invention is shown in FIG. 9. In step 80, the inverter controller monitors ongoing phase switch closure periods during PWM-based operation of the inverter. A check is performed in step 81 to determine whether any phase switch closure period is greater than the predetermined latency. If not, then monitoring continues by cycling between steps 80 and 81. If yes, then a check is performed in step 82 to determine whether the identified active DC leakage resistance detector matches the one needed in order to perform a leakage resistance measurement (i.e., when an upper phase leg switch is closed then the needed resistance leakage resistance value would come from the lower leakage detector circuit, and when a lower phase leg switch is closed then the matching detector is the upper leakage detector). If the phase switch meeting the timing requirement does not match with the currently active leakage detector circuit, then a return is made to step 80. If a match is found, then the leakage resistance value $R_L$ contained in the most recent data message is compared in step 83 to a first leakage resistant threshold $R_{T1}$ set at a relatively higher resistance level (i.e., a level adapted to detect a mild loss of isolation for which an appropriate response is to provide an operator warning). If the leakage resistance is greater than the first threshold, then a return is made to step 80 since no isolation fault is present. If leakage resistance is below first threshold $R_{T1}$, then leakage resistance $R_L$ is compared to a second leakage resistance threshold $R_{T2}$ in step 84 having a lower level than the first threshold and adapted to detect an isolation fault having a severity requiring intervention. If the leakage resistance is not below the second threshold, then a first DTC is set in step 85 reflecting the need for a driver warning or other actions consistent with addressing early stages of development of an isolation fault. If step 84 determines that the leakage resistance is less than the second threshold, then a second DTC is set in step 86 reflecting the need for intervention (such as a code that prevents motor restart).

In addition to detecting an electrical short of the AC load elements including the motor and motor cables during motor operation, the present invention can also localize an isolation fault when the inverter is not operating and the motor is not rotating, for example as in an off-line diagnostic test for an electrical short of the motor. Thus, an arbitrarily selected phase switch can be closed during such a diagnostic test together with activating a matching one of the leakage detector circuits so that the BECM controller supplies a data message to the inverter controller containing a measured resistance value characterizing leakage at the motor elements. After receiving the data message, the inverter controller opens the selected phase switch and compares the leakage resistance value from the data message with a threshold in order to detect any isolation fault of the motor and motor cables.

What is claimed is:

1. An electrified vehicle comprising:
   first and second DC buses connectable to a DC power source;
   a chassis ground distributed within the vehicle;
   a DC bus leakage detector circuit having a detector switch and a detector resistor in series between the first bus and the chassis ground wherein a voltage measured across the detector resistor is proportional to a leakage resistance between the second bus and the chassis ground;
   an inverter having a plurality of phase legs, each phase leg having first and second phase switches coupled between the first and second buses;
   an AC traction motor having a plurality of phases coupled to the phase legs; and
   an inverter control circuit coupled to the leakage detector circuit and to the phase legs, wherein the control circuit is adapted to a) receive data messages according to a predetermined latency period from the detector circuit identifying a measured leakage resistance, b) detect switching events during which a phase switch is closed for a duration greater than the latency period, and c) indicate an electrical short of the motor to the chassis ground if the measured leakage resistance in a data message received during a detected switching event is less than a predetermined threshold.

2. The vehicle of claim 1 further comprising:
   a second DC bus leakage detector circuit having a second detector switch and a second detector resistor in series between the second bus and the chassis ground wherein a second voltage measured across the second detector resistor is proportional to a second leakage resistance between the first bus and the chassis ground, wherein the bus leakage detectors alternately operate according to a predetermined period, and wherein each respective data message identifies which of the bus leakage detectors generated a respective measured leakage resistance;
   wherein the inverter control circuit is further adapted to detect the switching events according to only the first or second phase switches matching the bus leakage detector that is concurrently operating.

3. The vehicle of claim 1 wherein the inverter control circuit is further adapted to close a selected phase switch during a time when the motor is not rotating in order to obtain a measured leakage resistance as an offline diagnostic test for an electrical short of the motor.

4. The vehicle of claim 1 wherein the indication of an electrical short is comprised of setting a diagnostic trouble code in a diagnostic memory within the vehicle.

5. A method of detecting electrical shorts of an AC traction motor in an electrified vehicle, comprising the steps of:
   controllably switching a plurality of phase legs in an inverter, wherein each phase leg has first and second phase switches coupled between first and second DC buses, wherein an AC traction motor has a plurality of phases coupled to the phase legs, wherein the first and second buses are connected to a DC power source, and wherein switching of the phase legs drives rotation of the motor;
   repeatedly sampling a voltage across a detector resistor of a DC bus leakage detector circuit having a detector switch in series with the detector resistor between the first bus and a chassis ground, wherein the voltage is proportional to a leakage resistance between the second bus and the chassis ground, wherein the chassis ground is distributed within the vehicle, and wherein a plurality of sampled voltages are generated at a predetermined latency;
   detecting the occurrence of switching events during which a phase switch is closed for a duration greater than the latency period;
   in response to a detected switching event, comparing a leakage resistance for a respective sampled voltage with a predetermined threshold and indicating an electrical short of the motor to chassis ground if the leakage resistance is less than the predetermined threshold.

6. The method of claim 5 further comprising the step of:
   transmitting a data message via a multiplex bus to an inverter controller that controls the inverter, wherein the data message represents a respective sampled voltage from the detector circuit, and wherein the predetermined latency includes a transmission time for the data message.

7. The method of claim 6 wherein the data message originates from a battery energy controller that is coupled to the DC power source and the first and second DC buses.

8. The method of claim 5 further comprising the step of:
closing a selected phase switch during a time when the motor is not rotating in order to obtain a measured leakage resistance as an offline diagnostic test for an electrical short of the motor.

9. A method of detecting motor faults in an electrified vehicle with a traction motor and inverter, comprising:
measuring leakage resistance between a first DC bus and a chassis;
transmitting the leakage resistance to an inverter controller with a latency;
detecting activation of an inverter switch connected to a second DC bus for a time exceeding the latency;
indicating a motor short if a respective leakage resistance during detected activation is less than a threshold resistance.

10. The method of claim 9 further comprising:
measuring a second leakage resistance between the second DC bus and the chassis;
transmitting the second leakage resistance to the inverter controller with the latency;
detecting activation of another inverter switch connected to the first DC bus for another time exceeding the latency;
indicating a motor short if a respective leakage second resistance during detected activation is less than the threshold resistance.

* * * * *